United States Patent
Nazarian

(10) Patent No.: US 9,312,007 B2
(45) Date of Patent: *Apr. 12, 2016

(54) MEMORY DEVICE AND METHOD HAVING CHARGE LEVEL ASSIGNMENTS SELECTED TO MINIMIZE SIGNAL COUPLING

(71) Applicant: Micron Technology, Inc., Boise, ID (US)

(72) Inventor: Hagop A. Nazarian, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 75 days.

This patent is subject to a terminal disclaimer.

(21) Appl. No.: 13/759,716

(22) Filed: Feb. 5, 2013

(65) Prior Publication Data

US 2013/0141981 A1    Jun. 6, 2013

Related U.S. Application Data

(60) Continuation of application No. 13/292,783, filed on Nov. 9, 2011, now Pat. No. 8,379,442, which is a continuation of application No. 12/724,219, filed on Mar. 15, 2010, now Pat. No. 8,064,251, which is a (Continued)

(51) Int. Cl.
*G11C 16/10*    (2006.01)
*G11C 16/04*    (2006.01)
(Continued)

(52) U.S. Cl.
CPC ............ *G11C 16/04* (2013.01); *G11C 11/5628* (2013.01); *G11C 16/0483* (2013.01); *G11C 16/12* (2013.01); *G11C 16/3427* (2013.01);

(Continued)

(58) Field of Classification Search
CPC ........... G11C 11/5628; G11C 16/0483; G11C 16/12; G11C 16/3427
USPC ............. 365/185.03, 185.02, 185.12, 185.11, 365/185.17, 185.24, 185.33
See application file for complete search history.

(56) References Cited

U.S. PATENT DOCUMENTS 5,428,570 A    6/1995    Iwahashi
5,557,570 A    9/1996    Iwahashi
(Continued)

FOREIGN PATENT DOCUMENTS

EP    0899746 A2    3/1999

OTHER PUBLICATIONS

Decision of Rejection in PCT Application entering into China National Stage; issued Nov. 3, 2011 in Application No. 200780031780.4.

(Continued)

*Primary Examiner* — Andrew Q Tran
(74) *Attorney, Agent, or Firm* — Dorsey & Whitney LLP

(57) ABSTRACT

A non-volatile memory device programs memory cells in each row in a manner that minimizes the coupling of spurious signals. A control logic unit programs the cells in a row using a set of bit state assignments chosen by evaluating data that are to be written to the cells in the row. The control logic unit performs this evaluation by determining the number of cells in the row that will be programmed to each of a plurality of bit states corresponding to the write data. The control logic unit then selects a set of bit state assignments that will cause the programming level assigned to each bit state to be inversely proportional to the number of memory cells in the row that are programmed with the bit state. The selected set of bit states is then used to program the memory cells in the row.

13 Claims, 8 Drawing Sheets

Related U.S. Application Data division of application No. 12/272,590, filed on Nov. 17, 2008, now Pat. No. 7,697,324, which is a continuation of application No. 11/515,159, filed on Aug. 31, 2006, now Pat. No. 7,457,155.

(51) Int. Cl.
  *G11C 11/56* (2006.01)
  *G11C 16/12* (2006.01)
  *G11C 16/34* (2006.01)

(52) U.S. Cl.
  CPC .... *G11C 16/3418* (2013.01); *G11C 2211/5641* (2013.01); *G11C 2211/5643* (2013.01); *G11C 2211/5647* (2013.01)

(56) References Cited

U.S. PATENT DOCUMENTS

| | | | |
|---|---|---|---|
| 5,801,992 | A | 9/1998 | Hirano |
| 5,907,855 | A | 5/1999 | Norman |
| 6,002,614 | A | 12/1999 | Banks |
| 6,011,716 | A | 1/2000 | Banks |
| 6,014,327 | A | 1/2000 | Banks |
| 6,058,060 | A | 5/2000 | Wong |
| 6,100,752 | A | 8/2000 | Lee et al. |
| 6,118,692 | A | 9/2000 | Banks |
| 6,246,613 | B1 | 6/2001 | Banks |
| 6,353,554 | B1 | 3/2002 | Banks |
| 6,381,172 | B2 | 4/2002 | Banks |
| 6,434,050 | B2 | 8/2002 | Banks |
| 6,714,455 | B2 | 3/2004 | Banks |
| 6,847,555 | B2 | 1/2005 | Toda |
| 6,963,501 | B2 * | 11/2005 | Shiga ................ G11C 16/3454 365/185.03 |
| 6,999,366 | B2 | 2/2006 | Perner et al. |
| 7,006,380 | B2 | 2/2006 | Toda |
| 7,006,384 | B2 | 2/2006 | Banks |
| 7,068,542 | B2 | 6/2006 | Banks |
| 7,457,155 | B2 | 11/2008 | Nazarian |
| 7,697,324 | B2 | 4/2010 | Nazarian |
| 8,064,251 | B2 | 11/2011 | Nazarian |
| 8,379,442 | B2 * | 2/2013 | Nazarian ................ 365/185.02 |
| 2005/0078519 | A1 | 4/2005 | Shiga |
| 2008/0055984 | A1 | 3/2008 | Nazarian |
| 2012/0057404 | A1 | 3/2012 | Nazarian |

OTHER PUBLICATIONS

First Office Action of China State Intellectual Property Office for Application No. 200780031780.4, issued on Jun. 2, 2011.
International Search Report and Written Opinion, International Application No. PCT/US07/74867; mailed on Sep. 8, 2008.
Second Office Action of China State Intellectual Property Office for Application No. 200780031760.4, issued on Apr. 10, 2014.
Fourth Office Action Issued by State Intellectual Property Office for CN Application No. 200780031780.4 mailed on Jan 12, 2015.
Third Office Action Issued by China State Intellectual Property Office for Application No. 200780031780.4 issued on Aug. 27, 2014 with English Translation.

\* cited by examiner

MEMORY DEVICE AND METHOD HAVING CHARGE LEVEL ASSIGNMENTS SELECTED TO MINIMIZE SIGNAL COUPLING

CROSS-REFERENCE TO RELATED APPLICATIONS

This application is a continuation of U.S. patent application Ser. No. 13/292,783, filed Nov. 9, 2011, and issued as U.S. Pat. No. 8,379,442, which is a continuation of U.S. patent application Ser. No. 12/724,219, filed Mar. 15, 2010, and issued as U.S. Pat. No. 8,064,251, which is a divisional of U.S. patent application Ser. No. 12/272,590, filed Nov. 17, 2008, and issued as U.S. Pat. No. 7,697,324, which is a continuation of U.S. patent application Ser. No. 11/515,159, filed Aug. 31, 2006, and issued U.S. Pat. No. 7,457,155. These applications and patents are incorporated herein by reference, in their entirety, and for any purpose.

TECHNICAL FIELD

This invention relates to non-volatile memory devices, and, more particularly, to a non-volatile memory device in which the bit states assigned to multiple programming levels stored by memory cells are varied on a row-by-row basis to minimize signal coupling.

BACKGROUND OF THE INVENTION

Electrically erasable and programmable non-volatile memory devices having arrays of flash memory cells are found in a wide variety of electrical devices. One very common type of erasable and programmable non-volatile memory device is a flash memory device. A flash memory device uses flash memory cell, also known as a floating gate transistor memory cell, that are similar to a field effect transistor, having a source region and a drain region that is spaced apart from the source region to form an intermediate channel region. A floating gate, typically made of doped polysilicon, is disposed over the channel region and is electrically isolated from the channel region by a layer of gate oxide. A control gate is fabricated over the floating gate, and it can also be made of doped polysilicon. The control gate is electrically separated from the floating gate by a dielectric layer. Thus, the floating gate is "floating" in the sense that it is insulated from the channel, the control gate and all other components of the flash memory cell.

A flash memory cell is programmed by storing charge on the floating gate. The charge thereafter remains on the gate for an indefinite period even after power has been removed from the flash memory device. It is for this reason that flash memory devices are non-volatile. Charge is stored on the floating gate by applying appropriate voltages to the control gate and the drain or source. For example, a negative charge can be placed on the floating gate by grounding the source while applying a sufficiently large positive voltage to the control gate to attract electrons, which tunnel through the gate oxide to the floating gate from the channel region. The voltage applied to the control gate, called a programming voltage, determines the amount of charge residing on the floating gate after programming.

The flash memory cell can be read by applying a positive control gate to source voltage having a magnitude greater than a threshold voltage. The amount of charge stored on the flash memory cell determines the magnitude of the threshold voltage that must be applied to the control gate to allow the flash memory cell to conduct current between the source and the drain. As negative charge is added to the floating gate, the threshold voltage of the flash memory cell increases. During a read operation, a read voltage is applied to the control gate that is large enough to render the cell conductive if no charge is stored on the floating gate, but not large enough to render the cell conductive if charge is stored on the floating gate. During the read operation, the source is coupled to ground, and a positive voltage is applied through a suitable impedance to the drain, which is used as the output terminal of the cell. Therefore, if the floating gate of the flash memory cell is charged, the drain will remain at the positive voltage. If the floating gate of the flash memory cell is not charged, the cell will ground the drain.

Before a flash memory cell can be programmed, it must be erased by removing charge from the floating gate. The cell can be erased by applying a gate-to-source voltage to the cell that has a polarity opposite that used for programming. Specifically, the control gate is grounded, and a large positive voltage is applied to the source to cause the electrons to tunnel through the gate oxide and deplete the charge from the floating gate. In another approach, a relatively large negative voltage is applied to the control gate, and a positive voltage, such as a supply voltage, is applied to the source region.

A typical flash memory device includes a memory array containing a large number of flash memory cells arranged in rows and columns. Two common types of flash memory array architectures are the "NAND" and "NOR" architectures, so called for the logical form in which the basic flash memory cell configuration or each is arranged. FIG. 1 illustrates a typical NAND flash memory array 10 of conventional design. The array 10 is comprised of a large number of flash memory cells, collectively indicated by reference numeral 14. The array of flash memory cells 14 is typically divided into a number of blocks, with each block including a number of rows, such as, in the example shown in FIG. 1, 32 rows. The cells 14 in the same row have their control gates coupled to a common word select line 30, each of which receives a respective word line signal WL0-WL31. The cells 14 in the same column having their sources and drains connected to each other in series. Thus all of the memory cells 14 in the same column of each block are typically connected in series with each other. The drain of the upper flash memory cell 14 in the block is coupled to a bit line 20 through a first select gate transistor 24. The conductive state of the transistors 24 in each block are controlled by a source gate SG(D) signal. Each of the bit lines 20 output a respective bit line signal BL1-BLN indicative of the data bit stored in the respective column of the array 10. The bit lines 20 extend through multiple blocks to respective sense amplifiers (not shown). The source of the lower flash memory cell 14 in the block is coupled to a source line 26 through a second select gate transistor 28. The conductive state of the transistors 28 in each block are controlled by a source gate SG(S) signal. The source line 26 receives a signal SL having various magnitudes depending upon whether the memory cells 14 are being programmed, read or erased.

A read operation is performed on a row-by-row basis. When a read operation is to be performed for a selected block, the source line 26 is coupled to ground, and the select gate transistors 24, 28 for that block are turned ON responsive to high SG(D) and SG(S) signals. Also, the bit line 20 for each column is precharged to the supply voltage $V_{CC}$. Finally, a read voltage is applied to a word select line 30 for the selected row, thereby applying the read voltage to the control gates of all of the flash memory cells 14 in that row. As explained above, the magnitude of the read voltage is sufficient to turn ON all flash memory cells 14 that do not have a charged floating gate, but insufficient to turn ON all cells that have a charged floating gate. A voltage having a higher magnitude is applied to the word select lines 30 for all of the non-selected rows. This voltage is large enough to turn ON the flash memory cells 14 even if their floating gates are storing charge. As a result, the bit line 20 for each column will be low if the cell 14 in that column of the selected row is not storing charge. Otherwise the bit line 20 remains high at $V_{CC}$. The voltage on each bit line 20 is compared to a reference voltage by a respective sense amplifier (not shown). If the voltage on the bit line 20 is less than the reference voltage, the sense amplifier outputs a voltage corresponding to a "1" binary value of the read data bit. If the voltage on the bit line 20 is greater than the reference voltage, the sense amplifier outputs a voltage corresponding to a "0" binary value of the read data bit.

When a selected row of flash memory cells 14 are to be erased, the word select line 30 for the selected row is coupled to ground, and the source line 26 for each column is coupled to a positive voltage. A high SG(S) signal then turns ON the select gate transistors 28 to apply the positive voltage to the sources of the flash memory cells 14. The positive voltage then depletes charge from the floating gates in all of the cells 14, thereby erasing all of the memory cells 14 in the selected row. The flash memory cells 14 are normally erased on a block-by-block basis by grounding the word select lines 30 for all of the cells 14 in the block. Insofar as erasing the cells 14 removes charge from their floating gates, erasing the cells 14 effectively programs them to store logic "1" bit values.

When a selected row of cells 14 are to be programmed, a programming voltage is applied to the word select line 30 for the selected row, and a voltage sufficient to turn ON the remaining cells 14 is applied to the control gates of the remaining flash memory cells 14. Also, the first column select transistor 24 is turned ON and voltages corresponding to the data bits that are to be programmed are applied to the respective bit lines. If the voltage of a bit line 20 is at ground corresponding to a logic "0," charge will be stored in the floating gate of the flash memory cell 14 in that column of the selected row. Otherwise, a voltage on the bit line 20 corresponding to a logic "1" prevents any charge from being stored on the floating gate. Programming is therefore performed on a row-by-row basis.

The storage capacity of a flash memory array can be increased by storing multiple bits of data in each flash memory cell 14. This can be accomplished by storing multiple levels of charge on the floating gate of each cell 14. These memory devices are commonly referred to as multi-bit or multi-level flash memory cells, known as "MLC memory cells." In MLC cells, multiple bits of binary data corresponding to distinct threshold voltage levels defined over respective voltage ranges are stored within a single cell. Each distinct threshold voltage level corresponds to a respective combination of data bits. Specifically, the number N of bits requires $2^N$ distinct threshold voltage levels. For example, for a flash memory cell to store 2 bits of data, 4 distinct threshold voltage levels corresponding to bit states 00, 01, 10, and 11 are needed. When reading the state of the memory cell, the threshold voltage level for which the memory cell 14 conducts current corresponds to a combination of bits representing data programmed into the cell. The two or more bits stored in each flash memory cell 14 can be adjacent bits in the same page of data. However, more frequently, one bit is treated as a bit in one page of data, and the other bit is treated as the corresponding bit in an adjacent page of data. The bit states assigned to respective charge levels are normally the same for all rows of memory cells in an array. The bit states assigned to the flash memory cells in the array are usually implemented in hardware and thus cannot be changed during operation of the flash memory device.

A multi-level flash memory cell is programmed by applying a programming voltage to the control gate and holding the drain to a constant voltage over a proper time period to store enough charge in the floating gate to move the threshold voltage of the flash memory cell 14 to a desired level. This threshold voltage level represents a bit state of the cell corresponding to the combination of data bits stored in the cell. As with programming single-level flash cells, programming of multi-level cells is performed on a row-by-row basis.

FIG. 2A illustrates the cell data map for a conventional one-bit-per-cell flash cell. As shown in FIG. 2A, two separate charge levels or ranges are defined within the overall flash cell threshold voltage range. When reading from such a flash cell, all that is necessary is to determine whether the threshold voltage is above or below the midpoint between the two levels. Voltages in one level are interpreted as a single binary bit (zero or one) while voltages in the other level are interpreted as the complementary binary bit (one or zero).

FIG. 2B, on the other hand, illustrates the cell data map for a multi-level flash memory cell capable of storing two bits. As can be seen in FIG. 2B, the data map defines four separate charge ranges or levels (Levels 0, 1, 2, and 3) within the range of the cell's overall maximum threshold voltage. Each level is assigned a two-bit pair or bit-set 00, 01, 10, or 11. The multiple bits stored in each row can be used as adjacent bits in a single page of memory. Alternatively, the multiple bits stored in each row can be used as corresponding bits in two different pages of memory. For example, the data bits X,Y stored in the first column can be used so that X is the first data bit of one page, and Y is the first data bit of an adjacent page.

There is also a limit to the precision with which circuitry can store an analog value on the floating gate of a flash cell, particularly where multiple levels of charge must be stored. In particular, because of process variations, the flash cells across an entire array and even across a single row may not all behave identically. For these reasons, conventional circuitry for programming or erasing the flash cells typically perform these task in an algorithmic manner. Specifically, the circuitry applies an appropriate voltage level to the control gate of a cell to charge the floating gate to a specific level, then interrogates the cell to determine if the floating gate has been charged to that level. If the floating gate has not been sufficiently charged, the circuitry again applies an appropriate voltage level to the control gate of the cell. This process is repeated until the floating gate has been charged to the desired level.

As the demand for memory capacity continues to increase, flash memory devices are being fabricated with increasingly higher densities. As a result, the spacing between the components of a flash memory device continues to decrease. As the spacing between these components becomes smaller, signals are more easily coupled between adjacent components. A signal applied to one component can therefore generate a spurious signal in an adjacent component. For example, a programming voltage applied to a selected word line to program a memory cell in a selected column can be coupled to the floating gate of memory cells in non-selected columns of that same row. These program disturb effects can increase the charge stored on the floating gates of memory cells in the row that either have been programmed or are being programmed to a lower charge level, thereby resulting in data storage errors. Similarly, an increase in the voltage of a floating gate caused by programming a selected memory cell can be coupled to the floating gate of an adjacent non-selected memory cell, thereby also inadvertently affecting the charge stored on the floating gate of the non-selected memory cell. These floating gate-to-floating gate and program disturb problems are most acute when programming multi-level flash memory cells, and it is for that reason that this description primarily refers to multi-level flash memory cells. However, these types of floating gate-to-floating gate and program disturb problems or similar problems can also exist when programming single-level flash memory cells and possibly other types of volatile memory devices.

As mentioned above, a flash memory cell is programmed by applying a programming voltage to the control gate and holding the drain to a constant voltage over a proper time period to store enough charge in the floating gate to move the threshold voltage of the flash memory cell to a desired level. Programming a flash memory cell with a higher charge level therefore requires applying a high programming voltage to the control gate of the cell through a respective word line. The magnitude of a spurious signal coupled to a word line from an adjacent word line or to a floating gate of a memory cell from the floating gate of an adjacent memory cell increases with increasing programming voltage. Therefore, higher programming voltages tend to induce a greater degree of floating gate-to-floating gate coupling and program disturb effects. Unfortunately, the magnitude of a programming voltage that must be applied to the control gate of a flash memory cell is fixed by the characteristics of the memory device, the number of charge levels to which each cell can be programmed in a multi-level memory cell, and the bit set to which the cell is to be programmed. The bit set used to program the cell is, of course, determined by the value of the data that is to be stored in the memory device.

There is therefore a need for a non-volatile memory device and method that reduces the coupling of spurious signals to components of the device, such as floating gate-to-floating gate coupling and program disturb effects.

DETAILED DESCRIPTION

Figure 1:
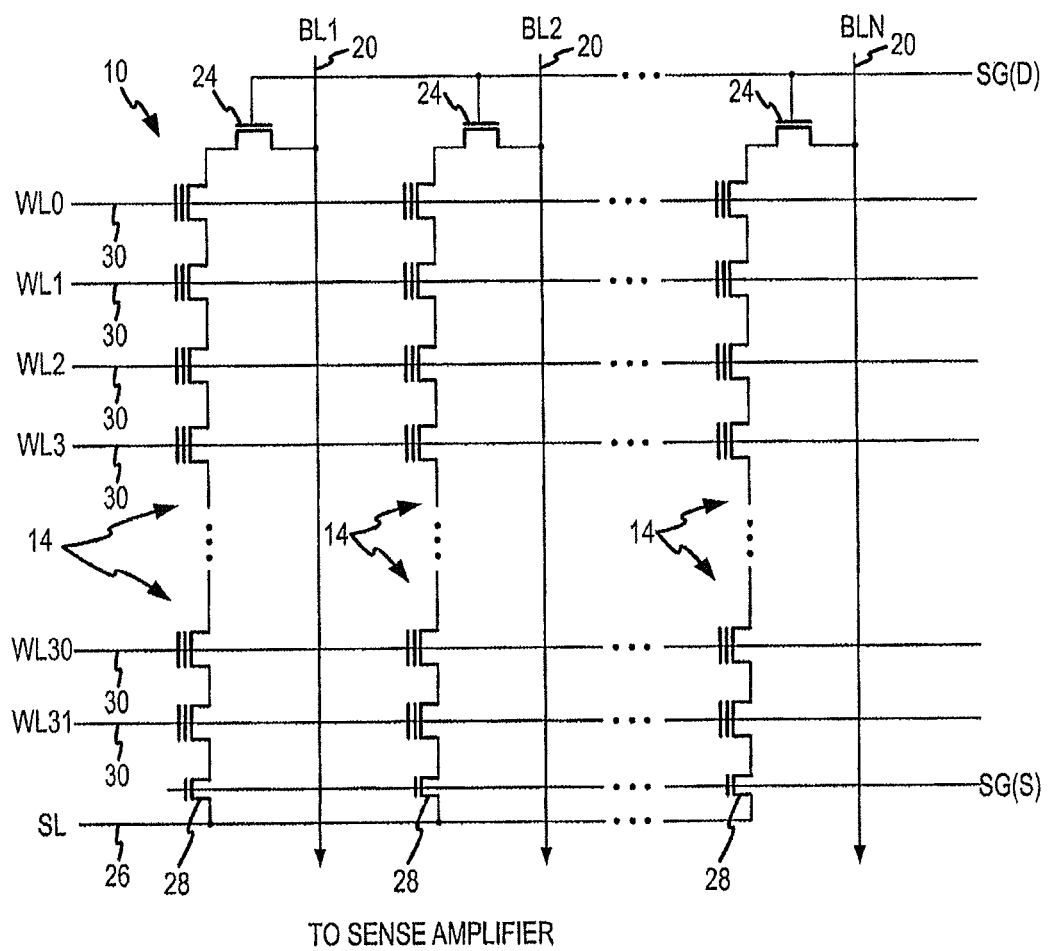
FIG. 1 is a schematic diagram showing a conventional NAND array of flash memory cells.
Figure 3:
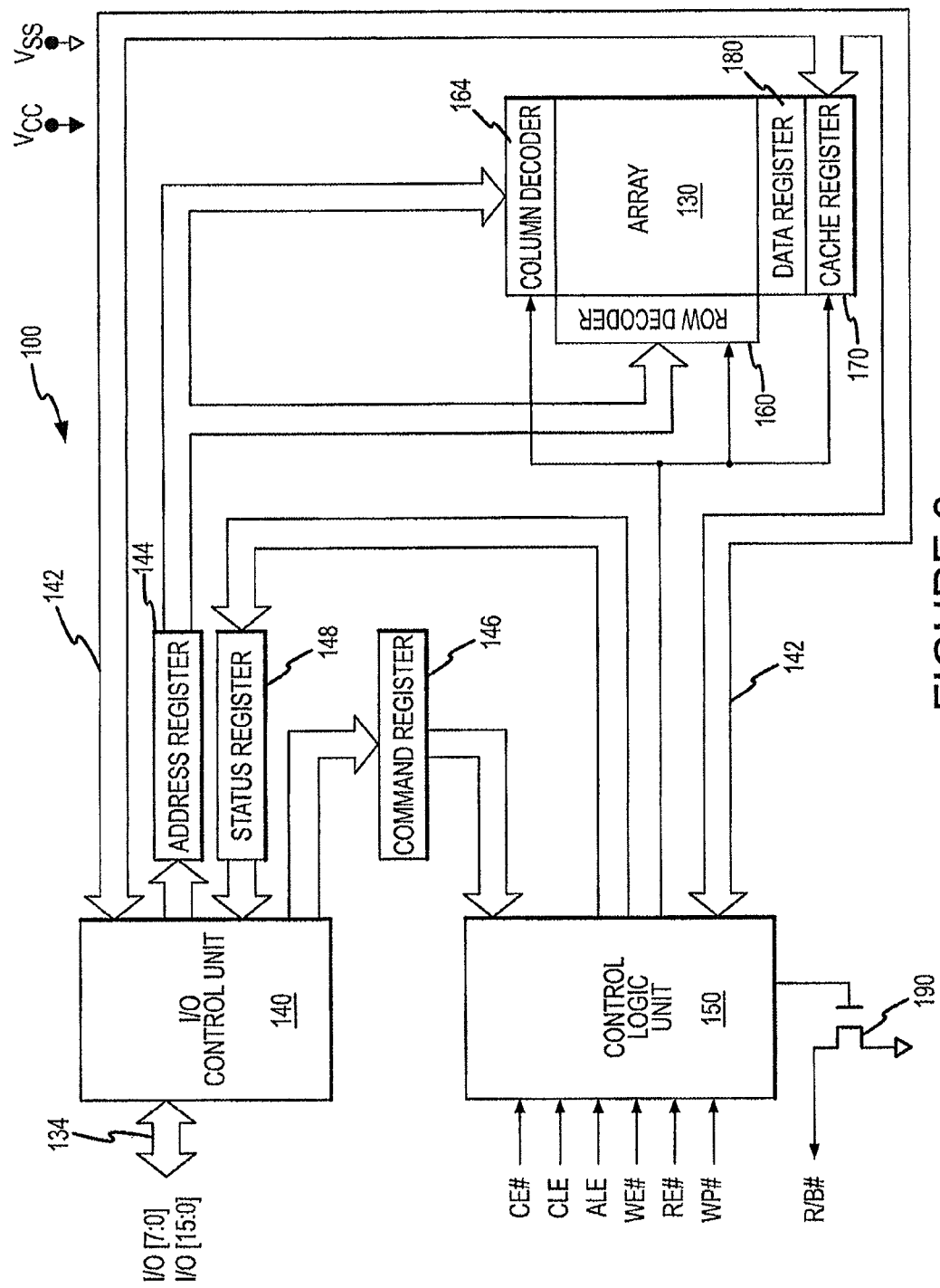
FIG. 3 is a block diagram showing a flash memory device according to one example of the invention.

A flash memory device 100 according to one example of the invention is shown in FIG. 3. The flash memory device 100 includes an array 130 of flash memory cells arranged in banks of rows and columns. The flash memory cells in the array 130 have their control gates coupled to word select lines, drain regions coupled to local bit lines, and source regions selectively coupled to a ground potential as shown in FIG. 1.

Unlike conventional dynamic random access memory ("DRAM") devices and static random access memory ("SRAM") devices, command, address and write data signals are not applied to the flash memory device 100 through respective command, address and data buses. Instead, most command signals, the address signals and the write data signals are applied to the memory device 100 as sets of sequential input/output ("I/O") signals transmitted through an I/O bus 134. Similarly, read data signals are output from the flash memory device 100 through the I/O bus 134. The I/O bus is connected to an I/O control unit 140 that routes the signals between the I/O bus 134 and an internal data bus 142, an address register 144, a command register 146 and a status register 148.

The flash memory device 100 also includes a control logic unit 150 that receives a number of control signals, including an active low chip enable signal CE#, a command latch enable signal CLE, an address latch enable signal ALE, an active low write enable signal WE#, an active low read enable signal RE#, and an active low write protect WP# signal. When the chip enable signal CE# is active low, command, address and data signals may be transferred between the memory device 100 and a memory access device (not shown). When the command latch enable signal CLE is active high and the ALE signal is low, the control logic unit 150 causes the I/O control unit 140 to route signals received through the I/O bus 134 to the command register 146 responsive to the rising edge of the WE# signal. Similarly, when the address latch enable signal ALE is active high and the CLE signal is low, the I/O control unit 140 routes signals received through the I/O bus 134 to the address register 146 responsive to the rising edge of the WE# signal. The write enable signal WE# is also used to gate write data signals from the memory access device (not shown) to the memory device 100, and the read enable signal RE# is used to gate the read data signals from the memory device 100 to the memory access device (not shown). The I/O control unit 140 transfers the write data signals and read data signals between the I/O bus 134 and the internal data bus 142 when the CLE and ALE signals are both low. Finally, an active low write protect signal WP# prevents the memory device 100 from inadvertently performing programming or erase functions. The control logic unit 150 is also coupled to the internal data bus 142 to receive write date from the I/O control unit for reasons that will be explained below.

The status register 148 can be read responsive to a read status command. After the read status command, all subsequent read commands will result in status data being read from the status register 148 until a subsequent read status command is received. The status data read from the status register 148 provides information about the operation of the memory device 100, such as whether programming and erase operations were completed without error.

The address register 146 stores row and column address signals applied to the memory device 100. The address register 146 then outputs the row address signals to a row decoder 160 and the column address signals to a column decoder 164. The row decoder 160 asserts word select lines 30 (FIG. 1) corresponding to the decoded row address signals. Similarly, the column decoder 164 enables write data signals to be applied to bit lines for columns corresponding to the column address signals and allow read data signals to be coupled from bit lines for columns corresponding to the column address signals.

In response to the memory commands decoded by the control logic unit 150, the flash memory cells in the array 130 are erased, programmed, or read. The memory array 130 is programmed on a row-by-row or page-by-page basis. After the row address signals have been loaded into the address register 146, the I/O control unit 140 routes write data signals to a cache register 170. The write data signals are stored in the cache register 170 in successive sets each having a size corresponding to the width of the I/O bus 134. The cache register 170 sequentially stores the sets of write data signals for an entire row or page of flash memory cells in the array 130. All of the stored write data signals are then used to program a row or page of memory cells in the array 130 selected by the row address stored in the address register 146. In a similar manner, during a read operation, data signals from a row or page of memory cells selected by the row address stored in the address register 146 are stored in a data register 180. Sets of data signals corresponding in size to the width of the I/O bus 134 are then sequentially transferred through the I/O control unit 140 from the data register 180 to the I/O bus 134. Although the array 130 is typically read on a row-by-row or page-by-page basis, a selected portion of a selected row or page may be read by specifying a corresponding column address.

The flash memory device 130 also includes an NMOS transistor 190 having its gate coupled to receive a signal from the control logic unit 150. When the memory device 100 is busy processing a programming, erase or read command, the control logic unit 150 outputs a high signal to cause the transistor 190 to output an active low read/busy signal R/B#. At other times, the transistor 190 is turned OFF to indicate to a memory access devices that the device 100 is able to accept and process memory commands.

Figure 2A:
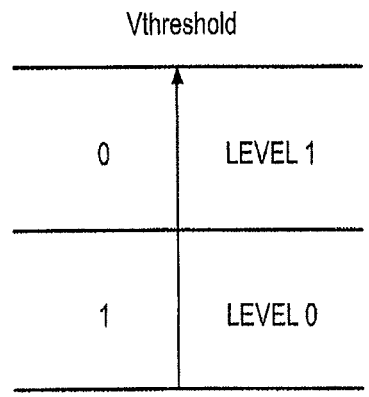
FIGS. 2A and 2B are schematic diagrams illustrating the manner in which the flash cells shown in FIG. 1 are programmed to store one or more data bits.
Figure 2B:
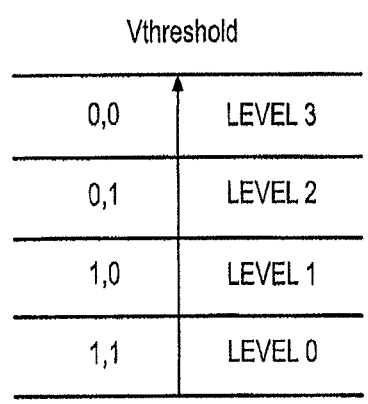
Figure 4A:
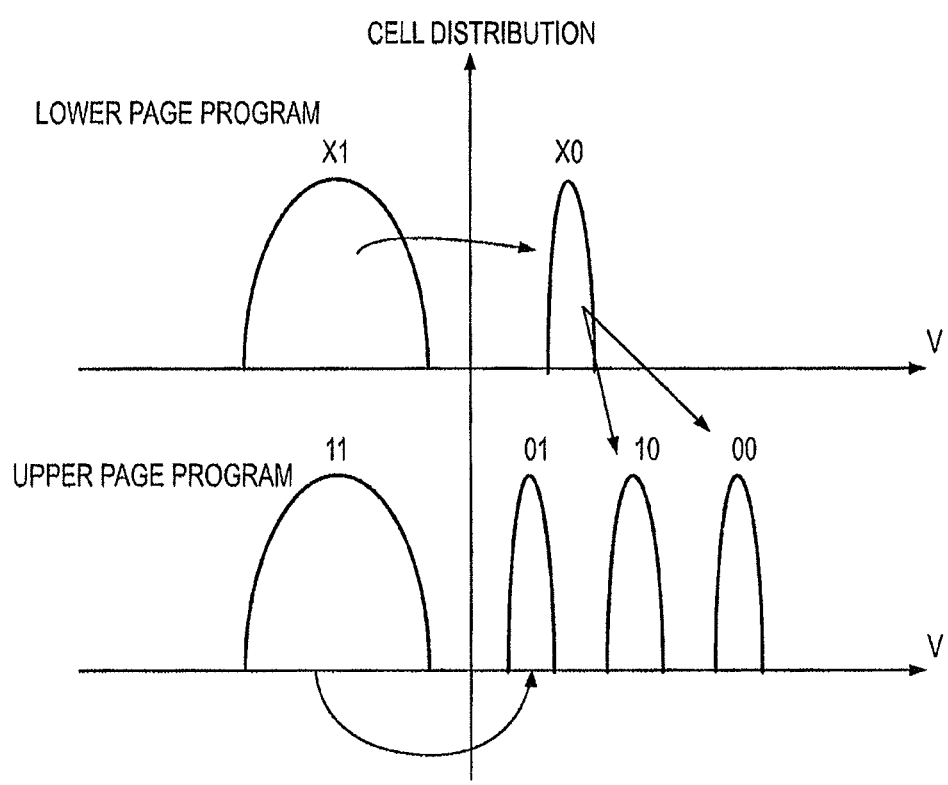
FIG. 4A is a schematic diagram illustrating one example of how each flash memory cell in the memory device of FIG. 3 can be programmed.

In a typical MLC cell 14, the erased state of the cell 14 is assigned the 11 state, the lowest level of charge is assigned the 01 state, the next level of charge is assigned the 10 state and the highest level of charge is assigned the 00 state, as shown in FIG. 2B. As also explained above, the two or more bits stored in each flash memory cell 14 are generally processed as corresponding bits in adjacent pages of data. Specifically, of the bits XY stored in a flash memory cell 14, the bit Y is a bit in a lower page of data, and the bit X is the corresponding bit in an upper page of data. The manner in which each cell can be programmed is illustrated in FIG. 4A in which the level of charge on the floating gate of the cell 14 is plotted along the horizontal axis. During programming, the bits Y for the entire lower page are stored in the cache register 170, and these bits are then used to program respective cells 14 as shown in the upper portion of FIG. 4A. If the bit Y for the lower page is 1, then the cell 14 remains in its erased state. If the bit Y for the lower page is 0, then the cell 14 is programmed to a level of charge identified by the X0 designation. While the cells 14 in a row are being programmed with the lower page of data, data bits X of an upper page are loaded into the cache register 170. These upper page data bits X are then used to program the flash memory cells 14 in the row that was previously programmed with the lower page data bits Y. Specifically, if the upper page data bit X is a 1 and the lower page data bit Y was a 1, then the cell 14 remains in its erased state. Otherwise, a small amount of charge is added to the floating gate of the cell 14 so that its charge level is indicated by the designation 01. If the lower page bit was 0 so that the charge was increased to the level designated by X0, then charge must be added when the cell 14 is programmed with the upper page bit. Specifically, if the upper page bit is a 1, then a first amount of charge is added to reach the charge level indicated by 10. If the upper page bit is a 0, then a greater amount of charge is added to reach the charge level indicated by 00. Alternatively, the cell 14 could have been programmed to the charge level designated by 10 when the cell 14 was programmed with a 0 lower page bit. In such case, an upper page bit of 1 would allow the level of charge to remain the same. However, if the upper page bit was 0, it would still be necessary to add charge to the floating gate of the cell 14 so that its charge level is indicated by the designation 00.

As mentioned above, programming a flash memory cell to increasing levels of charge requires a programming voltage of increasing magnitude. Therefore, the programming voltage required to program the cell 14 incrementally increases from bit state 01 to bit state 10 to bit state 00. As a result, programming a flash memory cell 14 to bit state 00 is more likely to induce floating gate-to-floating gate coupling and program disturb effects than programming a cell to bit state 10 or 01. Further, a row of memory cells that is predominantly programmed to bit state 00 is more likely to induce floating gate-to-floating gate coupling and program disturb effects than a row of memory cells in which fewer cells are programmed to bit state 00 or even bit state 10.

The set of bit state assignments shown in FIG. 2B are not the only set of bit state assignments that can be used in a multi-level flash memory device. In fact, there are a total of 24 different sets of bit state assignments that could be used. For example, the erased state could be assigned bit state 01, and increasing levels of charge could be assigned to bit states 00, 10 and 11, respectively. However, regardless of how the bit states are assigned, there would still be one bit set assigned to the maximum charge level. Programming a memory cell with the state assigned to this highest charge level would still tend to induce spurious signals in adjacent word lines and memory cell floating gates.

Figure 5:
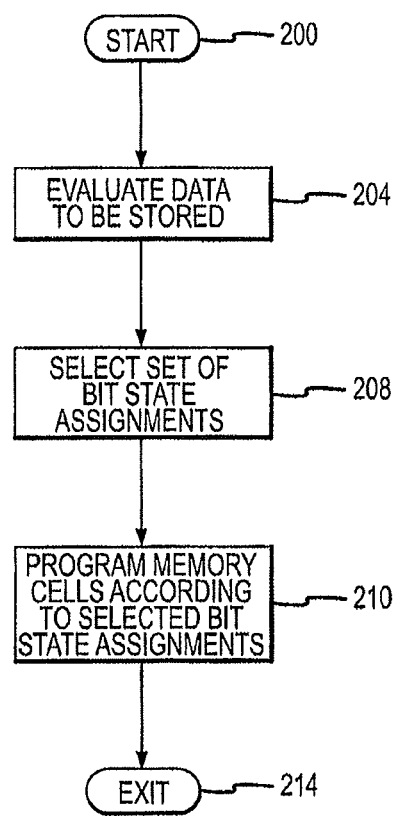
FIG. 5 is a flow chart showing one example of procedure for reassigning bit states to flash memory cells in the memory device of FIG. 3 to minimize the use of higher programming voltages.

According to one example of the invention, the control logic unit 150 (FIG. 3) is configured to minimize floating gate-to-floating gate coupling and program disturb effects using the procedure shown in FIG. 5. The procedure is entered at 200. When the control logic unit 150 is programming a row of memory cells, the control logic unit 150 receives the write data from the internal data bus 142, and evaluates the data that will be stored in the row at step 204 to determine the number of cells that will be programmed to each bit state. It is for this reason that the internal data bus 142 is coupled to the control logic unit 150. The control logic then selects a set of bit state assignments at step 208 based on this evaluation. Specifically, the control logic unit 150 assigns the erased charge level to the bit state to which the largest number of cells 14 are to be programmed, the lowest level of charge to the bit state to which the second largest number of cells 14 are to be programmed, the next level of charge to the bit state to which the third largest number of cells 14 are to be programmed, and the highest level of charge to the bit state to which the smallest number of cells 14 are to be programmed. The set of bit states used is thus selected on a row-by-row basis. Programming the flash memory cells 14 in this manner for each row thus minimizes the number of times the higher magnitudes of programming voltage will be applied to the corresponding word line. As a result, the likelihood that programming of a row of memory cells will induce floating gate-to-floating gate coupling and program disturb effects is minimized.

After the control logic unit 150 has selected the optimum bit state for the row at step 208, it programs memory cells in the row with bit states corresponding to the selected set of bit state assignments at step 210. Using the example where there are two bits stored in each cell, the one of 24 sets of bit state assignments would require that 3 memory cells in each row be reserved for storing an indication of the selected set of bit state assignments. The process then exits at step 214. Of course, the indication of the set of bit states assigned to each row could be stored by other means, such as by including a bit state assignment register (not shown) or other means for storing this information. Also, in the event a limited number of bit state assignments are used, flag bits can be assigned to the bit state assignments, and a flag bit is programmed to indicate the bit state assignment used for each row.

Figure 4B:
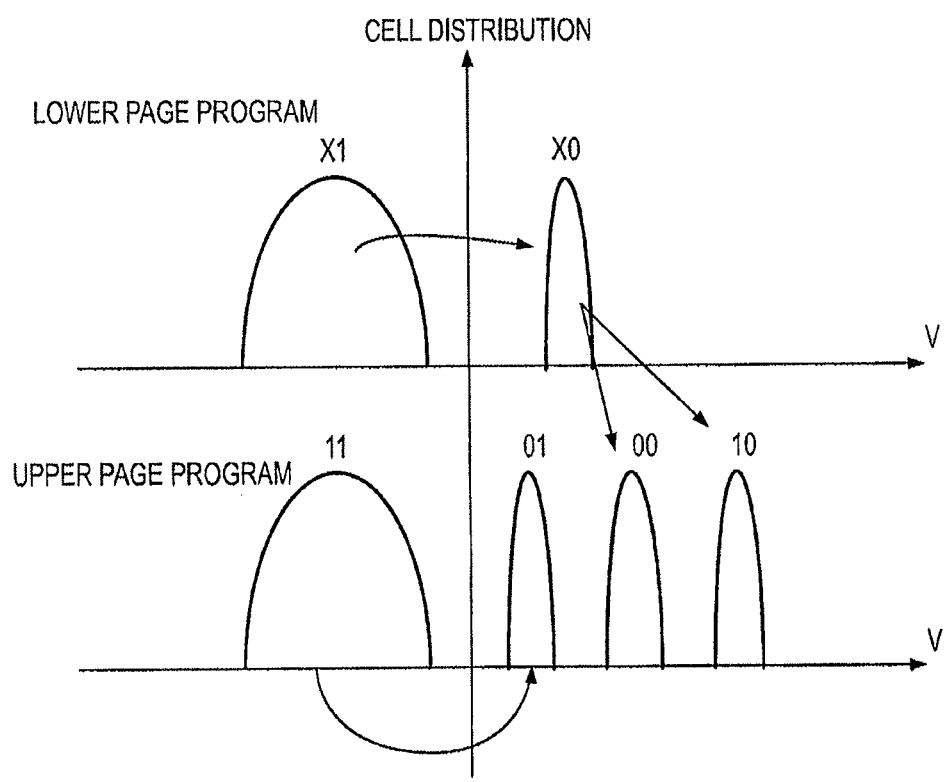
FIG. 4B is a schematic diagram illustrating one example of how the bit state assignment used in the example of FIG. 4A can be reassigned to reduce floating gate-to-floating gate coupling and program disturb effects.

Although the charge levels of all of the bit states to which the memory cells in a row are programmed can be selected in inverse order to the number of cells programmed to each charge level, it is also possible to simply reassign a limited number of bit states. For example, if largest number of cells in a row are to be programmed to bit state 00, the bit state assignment shown in FIG. 4B may be used. In this bit state assignment, only the bit states assigned to the two highest charge levels have been reassigned. Specifically, the bit state 00, to which the largest number of cells are programmed, is re-assigned from the highest charge level to the second highest charge level. The bit state 10 is then reassigned to the highest charge level, as also shown in FIG. 4B.

Figure 6:
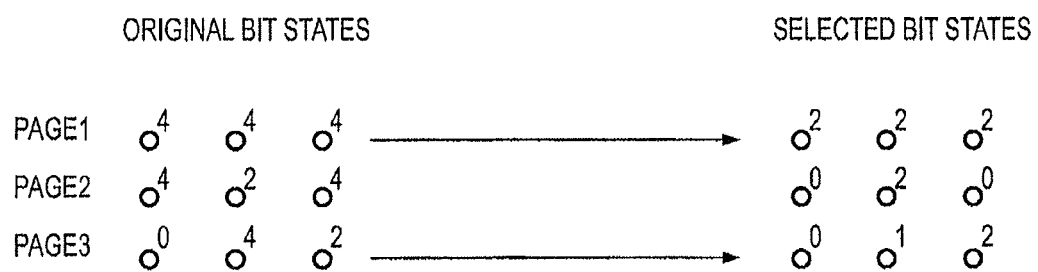
FIG. 6 is a simplified example showing how the bit states assigned to the flash memory cells can be reassigned using the procedure shown in FIG. 5.

A simple example of how a set of bit states can be assigned is illustrated in FIG. 6, in which each row contains three flash memory cells. In this example, the original bit states shown in FIG. 2B that would be used to program the memory cells in each row are shown along with the new bit states that would be used to program the memory cells in each row in accordance with one example of the invention. As shown in FIG. 6, all three memory cells in page (i.e., row) 1 are to be programmed with a bit state corresponding to the highest charge level. The control logic unit 150 therefore reassigns this bit state to the second charge level, although, of course, it could instead reassign this bit state to the lowest charge level or even the erased state. In page 2, two of the flash memory cells are to be programmed with a bit state corresponding to the highest charge level, and one of the flash memory cells is to be programmed with a bit state corresponding to the second charge level. The control logic unit 150 reassigns the bit state assigned to the highest charge level to the erased state, and leaves the bit state assigned to the second charge level unchanged. Finally, in page 3, one of the flash memory cells is to be programmed with a bit state corresponding to the erased state, one of the flash memory cells is to be programmed with a bit state corresponding to the highest charge level, and one of the flash memory cells is to be programmed with a bit state corresponding to the second charge level. The control logic unit 150 leaves the bit state assigned to the erased state unchanged, reassigns the bit state assigned to the highest charge level to the lowest charge level, and reassigns the bit state assigned to the highest charge level to the lowest charge level.

Figure 7:
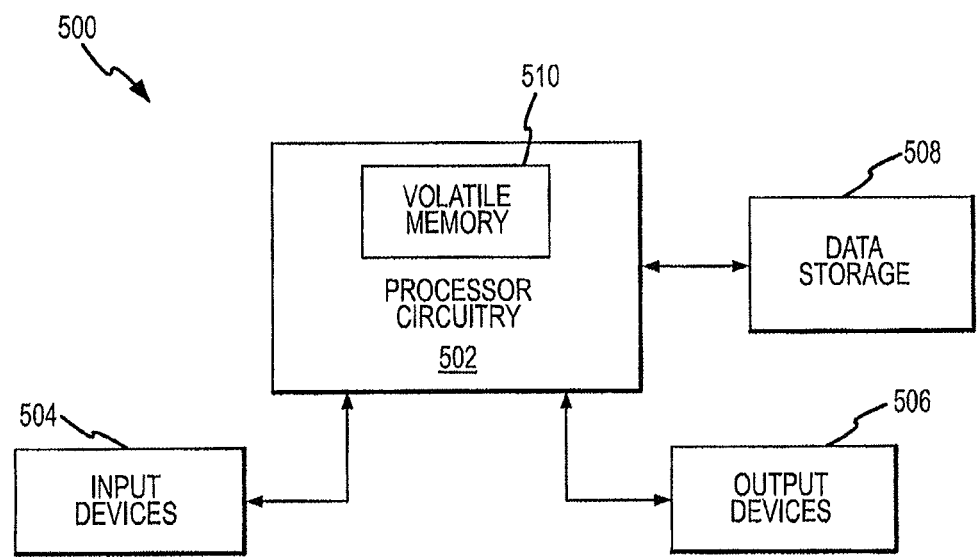
FIG. 7 is a simplified block diagram of a processor-based system including the flash memory device of FIG. 3 or a flash memory device according to some other example of the invention.

FIG. 7 is a block diagram of a processor-based system 500 including processor circuitry 502 having volatile memory 510. The processor circuitry 502 is coupled through address, data, and control buses to the volatile memory 510 to provide for writing data to and reading data from the volatile memory 510. The processor circuitry 502 includes circuitry for performing various processing functions, such as executing specific software to perform specific calculations or tasks. The processor-based system 500 also includes one or more input devices 504 coupled to the processor circuitry 502 to allow an operator to interface with the processor-based system 500. Examples of input devices 504 include keypads, touch screens, and scroll wheels. The processor-based system 500 also includes one or more output devices 506 coupled to the processor circuitry 502 to provide output information to the operator. In one example, the output device 506 is a visual display providing visual information to the operator. Data storage 508 is also coupled to the processor circuitry 502 to store data that is to be retained even when power is not supplied to the processor-based system 500 or to the data storage 508. The flash memory device 100, or a flash memory device according to some other example of the invention, can be used for the data storage 508.

Although the present invention has been described with reference to the disclosed embodiments, persons skilled in the art will recognize that changes may be made in form and detail without departing from the spirit and scope of the invention. Such modifications are well within the skill of those ordinarily skilled in the art. For example, although the example is described with respect to multi-level flash memory devices, it can also be applied to single-level flash memory devices and possibly some other non-volatile memory devices. Accordingly, the invention is not limited except as by the appended claims.

We claim:

1. An apparatus, comprising:
   a control logic configured to program a plurality of memory cells with one of a plurality of charge level assignments, each of the plurality of charge level assignments based, at least in part, on a number of memory cells in the plurality of memory cells that will be programmed with a respective state, and wherein the control logic is further configured to assign each of the plurality of charge level assignments to the respective state which is inversely proportional to the number of memory cells of the plurality of memory cells that are to be programmed with each of the respective states.

2. The apparatus of claim 1, wherein the control logic is further configured to store each of the charge level assignments in a register.

3. The apparatus of claim 1, wherein one of the respective states is an erased charge level.

4. The apparatus of claim 3, wherein the erased charge level comprises a bit state to which a largest number of memory cells in the plurality of memory cells will be programmed.

5. The apparatus of claim 1, wherein the plurality of memory cells is a first plurality of memory cells and wherein the control logic is further configured to program the first plurality of memory cells independently of a second plurality of memory cells.

6. The apparatus of claim 1, wherein the control logic is further configured to reassign each of the plurality of charge level assignments responsive, at least in part, to receipt of a set of data.

7. The apparatus of claim 1, wherein the plurality of memory cells comprises non-volatile memory cells.

8. A method comprising:
   determining a number of memory cells of a plurality of memory cells to be programmed to each of a plurality of charge level assignments, wherein the plurality of charge level assignments comprises more than two charge level assignments;
   programming each memory cell of the plurality of memory cells with a corresponding one of the plurality of charge level assignments; and
   assigning each of the plurality of charge level assignments to a respective state based, at least in part, on the number of memory cells in the plurality of memory cells that will be programmed with the respective state, wherein each of the plurality of charge level assignments will be assigned to the respective state which is inversely proportional to the number of memory cells.

9. The method of claim 8, further comprising:
reassigning each of the plurality of charge level assignments responsive, at least in part, to receipt of a set of data; and
storing each of the plurality of charge level assignments.

10. The method of claim 9, wherein said storing comprises:
providing a respective flag bit indicative of each of the reassigned plurality of charge level assignments; and
storing the respective flag bits.

11. The method of claim 8, wherein said programming comprises:
applying a programming voltage to a word line including a subset of memory cells of the plurality of memory cells.

12. The method of claim 11, further comprising:
before said programming the subsets of memory cells of the plurality of memory cells, determining respective numbers of each subset of memory cells of the plurality of memory cells to be programmed to each of the plurality of charge level assignments.

13. The method of claim 8, wherein one of the respective states comprises an erased charge level.

* * * * *